United States Patent

[11] 3,615,448

[72] Inventor Leon Yeshin
Montreal, Quebec, Canada
[21] Appl. No. 791,167
[22] Filed Jan. 14, 1969
[45] Patented Oct. 26, 1971
[73] Assignee W. R. Grace & Co
New York, N.Y.

[54] LITHOGRAPHIC PRINTING PLATE AND METHOD OF PREPARATION
23 Claims, No Drawings

[52] U.S. Cl. .................................................. 96/33, 96/48 HD, 96/115 P
[51] Int. Cl. .................................................. G03f 7/02
[50] Field of Search .......................................... 96/35.1, 33, 48 HD, 115 P

[56] References Cited
UNITED STATES PATENTS 3,055,758 9/1962 McDonald .................... 96/33
3,388,995 6/1968 Schwerin et al. ............. 96/33

*Primary Examiner*—Norman G. Torchin
*Assistant Examiner*—John Winkelman
*Attorney*—Kenneth E. Prince

ABSTRACT: A lithographic (planographic) printing plate is prepared from an element comprising a layer of a photocurable composition containing finely divided particles of a vinyl plastic. The layer is exposed imagewise to U.V. radiation, which photocures the photocurable composition, and then is uniformly heat fluxed, whereby the photocurable composition plasticizes the plastic vinyl in the nonexposed areas. The imagewise exposure is through a stencil, or a negative or positive transparency (halftone or line.) The exposed areas are either oleophilic or hydrophilic in relation to the nonexposed areas. The homopolymer of vinyl chloride is the preferred vinyl plastic.

LITHOGRAPHIC PRINTING PLATE AND METHOD OF PREPARATION

BACKGROUND OF THE INVENTION

1. Objectives of the Invention

It is an object of this invention to provide a new and improved lithographic surface. Another object is to provide a lithographic surface that is easy to make and has a long image life. Another object is to provide a lithographic surface that has an image which is easily produced by photocuring a photocurable layer. Another object of this invention is to provide a lithographic printing plate which requires no chemical development or etching before its use. Another object is to produce a lithographic printing plate from photocurable compositions which is essentially planographic on its printing surface. Another object is to produce a lithographic printing plate from a photocurable composition which contains a vinyl plastic therein which forms a hydrophilic layer upon being heat-fluxedo Still further objects will be apparent from the following description of this invention.

2. Prior Art

The general principle upon which lithographic printing is based involves the making of a printing image which is relatively ink-receptive (or oleophilic) on a background surface which is comparatively water-receptive (or hydrophilic). In general, lithography involves moistening of the nonimage areas of the plate with water or a fountain solution which is normally water-containing, to make the nonimage areas ink-repellant, inking the image areas by some convenient means, such as, rollers, and then transferring the ink to a receiving surface, such as, paper. The ink transfer is usually done by means of the application of pressure to the image-bearing lithographic plate. The two most common means of lithographic printing are direct rotary and offset rotary lithography.

The use of the photographic reproduction technique to produce a lithographic printing plate is old in the art. Those methods include the use of coated paper wherein the coating is sensitive to light and it also involves placing light-sensitive compositions on metal supports. U.S. Pat. No. 3,210,187, issued Oct. 5, 1965, discloses a method for preparing a lithographic printing plate from a photopolymerizable unit which is essentially composed of a photopolymerizable layer and a support layer, where said photopolymerizable layer is exposed to actinic light to form a polymer image. The unexposed and unpolymerized areas of the photopolymerizable layer are removed to yield the photopolymerized relief image. The underlying support area is relatively hydrophilic in relation to the oleophilic photopolymerized relief image—thus a lithographic printing plate having a relief image has been formed.

BROAD DESCRIPTION OF THE INVENTION

This invention broadly involves a process for preparing a lithographic printing plate which does not contain a relief image. The lithographic printing plate is prepared from a photocurable element which includes a support layer and a layer containing a photocurable composition and a vinyl plastic. The process itself involves exposing imagewise the layer containing the photocurable composition and vinyl plastic to radiation containing a substantial amount of ultraviolet radiation, for example, actinic radiation, whereby the exposed areas of the photocurable layer are hardened to an insoluble, flexible state. The process further involves heat-fluxing the photocurable composition which causes the uncured photocurable polymer composition to plasticize the vinyl plastic in those areas which were not exposed to the U.V. radiation. A transparent, tough, plasticized, vinyl plastic film results which is relatively hydrophilic. Upon wetting with water or a fountain solution, the unexposed areas usually show a greater affinity for water than do the exposed surface areas. The resultant lithographic printing plate can be placed upon a lithographic press and used to print a substantial number of copies. Any standard lithographic ink can be used in using said printing plate for lithographic printing. The support layer can be transparent and the imagewise exposure can be directed through said transparent support layer, although a direct exposure to the top layer is preferred. In a preferred embodiment, the vinyl plastic is the homopolymer of vinyl chloride.

This invention includes a photocurable element which includes a support layer and a layer containing a vinyl plastic and a photocurable composition. This invention also includes a lithographic printing plate wherein a photocured image, which is relatively oleophilic, is contained on and in a photocurable layer and a heat-fluxed image containing a plasticized vinyl plastic, which is hydrophilic, is contained on the same layer. The printing also contains a support layer for said photocurable layer. DETAILED DESCRIPTION OF THE INVENTION The photocurable layer contains two essential ingredients. The first being a vinyl plastic and the second being a photocurable composition. The vinyl plastic is present in an amount between about 25 and about 90 percent by weight of the photocurable composition.

Vinyl compounds useful in this invention for polymerization are those monomers having the vinyl grouping, that is, a carbon-to-carbon double bond is present in the monomer molecule which opens during polymerization to produce a polymer carbon chain. This vinyl grouping can be a terminal vinyl group, i.e., $R_1R_2C{=}CR_3-$, and/or a vinylidene group, i.e., $$>C=CR_4R_5,$$

and/or a transolefinic group, i.e., $$-CR_6=CR_7-.$$

The useful vinyl compounds are characterized in that they are highly reactive and polymerized easily. The useful homopolymers or copolymers obtained from the above vinyl monomers are those which are broadly termed vinyl plastics. As used within this invention, the term "vinyl plastics" includes polymers and resins derived by homopolymerization or copolymerization of vinyl monomers, such as vinyl esters, halovinyl compounds, halovinylidene compounds, esters of acrylic acid, acrylic acid, acrylic acid salts, etc. In essence, to be useful the vinyl plastics must form hard, insoluble, relatively hydrophilic compositions when heat-fluxed in the presence of the unexposed photocurable polymer composition.

One of the key requirements of the vinyl plastic component is that the polymer be a solid thermoplastic material which can be converted to and used as a free-flowing powder, i.e., a particulate form. The vinyl plastic should not be an amorphous rubber. This vinyl plastic powder, when combined with the liquid photocurable composition, forms either a paste dispersion or a plastisol, both of which are useful forms for subsequent use as a photocurable layer in the practice of this invention.

The preferred vinyl plastic is the homopolymer of vinyl chloride. The homopolymer of vinyl chloride has the formula: $(-CH_2-CHCl-)_n$, where $n$ is the number of repeating units. Also, the preferred vinyl plastics include copolymers of vinyl chloride with vinyl acetate or vinylidene chloride.

A partial listing of vinyl monomers, from which useful vinyl plastics (homo- and copolymers), can be produced, are given in the following paragraphs Examples of useful acrylic acid ester monomers those having the formula, $CH_2{=}CHCOOR$, where R can be, among other things: methyl; ethyl; propyl; butyl; isopropyl; isobutyl; sec-butyl; 2-methylbutyl; 3-methylbutyl; 1-ethylpropyl; 2-methylpentyl; 2-ethylbutyl; 1,3-dimethylbutyl; 1-methylhexyl; 2-ethylhexyl; allyl; 1-methylallyl; 2-chloroallyl; and 2-methoxyethyl. Other examples of useful acrylic acid derivative monomers are: sodium acrylate; calcium acrylate; potassium acrylate; acrylamide; acrylonitrile; and acryloyl chloride. Examples of useful methacryloyl halides are methacryloyl chloride and methacryloyl bromide. Examples of useful amide derivatives of methacrylic acid are N-methylmethacrylamide and N-isopropylmethacrylamide. Examples of useful methacrylic ester monomers are methyl methacrylate; ethyl methacrylate; propyl methacrylate; isopropyl methacrylate; isobutyl methacrylate; and tert-butyl methacrylate.

Examples of useful vinyl ester monomers are: vinyl benzoate, vinyl formate, and vinyl p-methoxybenzoate. Examples of useful vinylamine monomers are N-vinylcarbazole, N-vinyl indole; and N-vinyl pyrrole. Examples of useful halovinyl monomers, other than vinyl chloride, are vinyl bromide, vinyl fluoride and vinyl iodide. Examples of useful monomers are the vinyl ethers ($CH_2$=CHOR) of amino alcohols which are disclosed in table 9 on page 616 of Schildnecht, Vinyl and Related Polymers, John Wiley and Sons, Inc. New York (1952); and alicyclic vinyl ethers which are disclosed in table 13 on page 621 of Schildknecht, supra; and the vinyl aryl ethers which are disclosed in table 14 on page 623 of Schildknecht, supra; all of which are incorporated by reference into this specification. Other useful vinyl monomers are vinyl isocyanate; acrolein; methacrolein; and N-monovinyl ethyleneurea; styrene; 3,5-dimethylstyrene; 2,4-dimethylstyrene; and 2,5-dimethylstyrene. Examples of useful monomers are the α-methylstyrene derivatives which are disclosed in table 1 on page 130 of Schildknecht, supra; the chlorostyrenes disclosed in table 8 on page 148 of Schildknecht, supra; the bromo-, iodo- and fluoro- substituted styrenes disclosed in table 10 on page 152 of Schildknecht, supra; the cyano-, carboxy-, hydroxy-, nitro- and amine styrenes disclosed in table 11 on page 157 of Schildknecht, supra; and the vinyl derivatives of biphenyl, naphthalene and related compounds which are disclosed in table 12 on page 163 of Schildknecht, supra; all of which are incorporated into this specification.

Homopolymers of materials like ethylene and propylene are useful.

Examples of useful monomers which can be copolymerized with acrylonitrile are styrene; α-methylstyrene; α-hydroxymethylacrylonitrile; vinyl chloride; vinylidene chloride; acrylic acid; and methacrylic acid.

Various methods of preparing the vinyl plastics from the above useful monomers are well known to the art, for example, many of the methods of preparation are given in Schildknecht, supra.

The vinyl plastic composition can be a blend of several vinyl polymers.

To facilitate compounding the photocurable composition and the subsequent coating thereof on a support, it may be desirable to initially place the vinyl plastic in a small amount of solvent.

The crucial ingredients in the photocurable composition are 1. about 2 to about 98 parts by weight of an ethylenically unsaturated polyene containing two or more reactive unsaturated carbon to carbon bonds;
2. about 98 to about 2 parts by weight of a polythiol;
3. about 0.0005 to about 50 parts by weight [based on 100 parts by weight of (1) and (2) ] of a photocuring rate accelerator; and
4. about 25 to about 90 parts by weight [based on 100 parts by weight of (1) and (2) and (3) ] of a vinyl plastic.

The reactive carbon to carbon bonds of the polyenes are preferably located terminally, near terminally, and/or pendant from the main chain. The polythiols, preferably, contain two or more thiol groups per molecule. These photocurable compositions are usually, and preferably, liquid at room temperatures, although the compositions can be solid, crystalline, semisolid, etc., at those temperatures, but which are liquid at 70° C.

Included in the term "liquid", as used herein, are those photocurable compositions which in the presence of inert solvent, aqueous dispersion or plasticizer have a viscosity ranging from essentially zero to 20 million centipoises at 70° C.

As used herein polyenes and polyynes refer to simple or complex species of alkenes or alkynes having a multiplicity, i.e., at least 2, "reactive" carbon to carbon unsaturated functional groups per average molecule. For example, a diene is a polyene that has two "reactive" carbon to carbon double bonds per average molecule, while a diyne is a polyyne that contains in its structure two "reactive" carbon to carbon triple bonds per average molecule. Combinations of "reactive" double bonds and "reactive" triple bonds within the same molecule are also operable. An example of this is monovinylacetylene, which is a polyeneyne under our definition. For purposes of brevity all these classes of compounds will be referred to herein as polyenes.

As used herein the term "reactive" unsaturated carbon to carbon groups means groups which will react under proper conditions as set forth herein with thiol groups to yield the thioether linkage $$(-\overset{|}{\underset{|}{C}}-S-\overset{|}{\underset{|}{C}}-),$$

as contrasted to the term "unreactive" carbon to carbon unsaturation which means $$-\overset{|}{C}=\overset{|}{C}-$$

groups when found in aromatic nucleii (cyclic structures exemplified by benzene, pyridine, anthracene, and the like) which do not under the same conditions react with thiols to give thioether linkages. In the instant invention products from the reaction of polyenes with polythiols which contain 2 or more thiol groups per average molecule are called polythioether polymers or polythioethers.

Methods of preparing various polyenes useful within the scope of this invention are disclosed in copending application have Ser. No. 674,773, filed Oct. 12, 1967, and assigned to the same assignee. Some of the useful polyenes are prepared in the detailed examples, set forth in the following specification.

One group of polyenes operable in the instant invention is that taught in a copending application having Ser. No. 617,801, inventors: Kehr and Wszolek, filed: Feb. 23, 1967, and assigned to the same assignee. This group includes those having a molecular weight in the range of 50 to 20,000, a viscosity ranging from 0 to 20 million centipoises at 70° C. of the general formula: $[A]-(X)_m$ wherein X is a member of the group consisting of $$R-\overset{R}{\overset{|}{C}}=\overset{R}{\overset{|}{C}}-$$

and R—C≡C—; *m* is at least 2; R is independently selected from the group consisting of hydrogen, halogen, aryl, substituted aryl, cycloalkyl, substituted cycloalkyl, aralkyl, substituted aralkyl and alkyl and substituted alkyl groups containing 1 to 16 carbon atoms and A is a polyvalent organic moiety free of (1) reactive carbon to carbon unsaturation and (2) unsaturated groups in conjugation with the reactive ene or yne groups in X. Thus A may contain cyclic groupings and minor amounts of hetero atoms such as N, S, P or O but contains primarily carbon-carbon, carbon-oxygen or silicon-oxygen containing chain linkages without any reactive carbon to carbon unsaturation. This group preferably has a molecular weight over 300.

In this first group, the polyenes are simple or complex species of alkenes or alkynes having a multiplicity of pendant, terminally or near terminally positioned "reactive" carbon to carbon unsaturated functional groups per average molecule. As used herein for determining the position of the reactive functional carbon to carbon unsaturation the term "terminal" means that said functional unsaturation is at an end of the main chain in the molecule; whereas by "near terminal" is meant that the functional unsaturation is not more than 16 carbon atoms away from an end of the main chain in the molecule. The term "pendant" means that the reactive carbon to carbon unsaturation is located terminally or near terminally in a branch of the main chain as contrasted to a position at or near the ends of the main chain. For purposes of brevity all of these positions will be referred to generally as "terminal" unsaturation.

The liquid polyenes operable in this first group contain one or more of the following types of nonaromatic and nonconjugated "reactive" carbon to carbon unsaturation:

(1) $-CH=CH-$ (5) $>C=C<$ (2) $-C\equiv C-$ (6) $>C=CH-$ (3) $-CH=CH_2$ (7) $-CH=C<$ (4) $-C\equiv CH$ (8) $>C=CH_2$ These functional groups as shown in 1–8 supra are situated in a position either which is pendant, terminal or near terminal with respect to the main chain but are free of terminal conjugation. As used herein the phrase "free of terminal conjugation" means that the terminal "reactive" unsaturated groupings may not be linked directly to nonreactive unsaturated species such as $$-\overset{O}{\overset{\|}{C}}-,\quad -\underset{\underset{O}{\|}}{\overset{O}{\overset{\|}{S}}}-,\quad -\underset{|}{\overset{O}{\overset{\|}{P}}}-$$

and the like so as to form a conjugated system of unsaturated bonds exemplified by the following structure:

$$R-\overset{R}{\overset{|}{C}}=\overset{R}{\overset{|}{C}}-\overset{O}{\overset{\|}{C}}-$$

etc. On the average the polyenes must contain 2 or more "reactive" unsaturated carbon to carbon bonds/molecule and have a viscosity in the range from slightly above 0 to about 20 million centipoises at 70° C. Included in the term "polyenes" as used herein are those materials which in the presence of an inert solvent, aqueous dispersion or plasticizer fill within the viscosity range set out above at 70° C. Operable polyenes in the instant invention have molecular weights in the range of about 50 to about 20,000, preferably about 500 to about 10,000.

Examples of operable polyenes from this first group include, but are not limited to:

1. crotyl-terminated polyurethanes which contain two "reactive" double bonds per average molecule in a near terminal position of the average general formula:

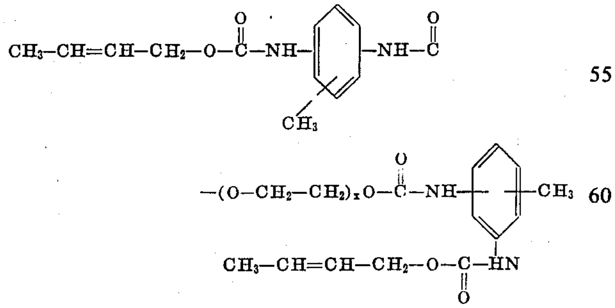

Wherein $x$ is at least 1, 2. ethylene/propylene/non-conjugated diene terpolymers, such as "Nordel 1040"X manufactured by E. I duPont de Nemours & Co., Inc., which contains pendant "reactive" double bonds of the formula: $-CH_2-CH=CH-CH_3$, 3. The following structure which contains terminal "reactive" double bonds:

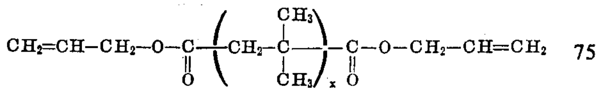

where $x$ is at least 1.

4. The following structure which contains near terminal "reactive" double bonds $$CH_3(CH_2)_7-CH=CH-(CH_2)_7-\overset{O}{\overset{\|}{C}}-(OC_3H_6)_x-O-\overset{O}{\overset{\|}{C}}-(CH_2)_7-CH=CH-(CH_2)_7CH_3$$

where $x$ is at least 1.

Another, or second, group of operable polyenes includes those unsaturated polymers in which the double or triple bonds occur primarily within the main chain of the molecules. Examples include conventional elastomers (derived primarily from standard diene monomers) such as polyisoprene, polybutadiene, styrene-butadiene rubber, isobutylene-isoprene rubber, polychloroprene, styrene-butadiene-acrylonitrile rubber and the like; unsaturated polyesters, polyamides, and polyurethanes derived from monomers containing "reactive" unsaturation, e.g., adipic acid-butenediol, 1,6-hexanediamine-fumaric acid and 2,4-tolylene diisocyanate-butenediol condensation polymers and the like.

A third group of polyenes operable in this invention includes those polyenes in which the reactive unsaturated carbon to carbon bonds are conjugated with adjacent unsaturated groupings. Examples of operable conjugated reactive ene systems include but are not limited to the following $$-\underset{|}{C}=\underset{|}{C}-\underset{\|}{C}-,\quad -\underset{|}{C}=\underset{|}{C}-\underset{\underset{O}{\|}}{\overset{O}{\overset{\|}{S}}}-,\ \text{and}\ -\underset{|}{C}-\underset{|}{C}-\underset{|}{\overset{O}{\overset{\|}{P}}}-$$

A few typical examples of polymeric polyenes which contain conjugated reactive double bond groupings such as those described above are poly (oxyethylene) a glycol (600 M.W.) acrylate, poly(oxytetramethylene) glycol (1,000 M.W.) dimethacrylate, the triacrylate of the reaction product of trimethylol propane with 20 moles of ethylene oxide, and the like.

As used herein, the term polythiols refers to simple or complex organic compounds having a multiplicity of pendant or terminally positioned —SH functional groups per average On the average the polythiols must contain 2 or more —SH groups/molecule. They usually have a viscosity range of slightly above 0 to about 20 million centipoises (cps) at 70° C., as measured by a Brookfield Viscometer. Included in the term "polythiols" as used herein are those materials which in the presence of an inert solvent, aqueous dispersion or plasticizer fall within the viscosity range set out above at 70° C. Operable polythiols in the instant invention usually have molecular weights in the range about 50 to about 20,000, or more, preferably about 100 to about 10,000.

The polythiols operable in the instant invention can be exemplified by the general formula: $R_8-(SH)_n$ where $n$ is at least 2 and $R_8$ is a polyvalent organic moiety free from "reactive" carbon to carbon unsaturation. Thus $R_8$ may contain cyclic groupings and minor amounts of hetero atoms such as N, S, P or O but primarily contains carbon-hydrogen, carbon-oxygen, or silicon-oxygen containing chain linkages free of any "reactive" carbon to carbon unsaturation.

One class of polythiols operable with polyenes in the instant invention to obtain essentially odorless cured polythioether printing plates are esters of thiol-containing acids of the general formula: $HS-R_9-COOH$ where $R_9$ is an organic moiety containing no "reactive" carbon to carbon unsaturation with polyhydroxy compounds of the general structure: $R_{10}-(OH)_n$ where $R_{10}$ is an organic moiety containing no "reactive" carbon to carbon unsaturation and $n$ is 2 or greater. These components will react under suitable conditions to give a polythiol having the general structure:

$$R_{10}-(O\overset{O}{\overset{\|}{C}}-R_9-SH)_n$$

where $R_9$ and $R_{10}$ are organic moieties containing no "reactive" carbon to carbon unsaturation and $n$ is 2 or more greater.

Certain polythiols such as the aliphatic monomeric polythiols (ethane dithiols, hexamethylene dithiol, decamethylene dithiol, tolylene-2,4-dithiol, etc.) and some polymeric polythiols such as a thiol-terminated ethylcyclohexyl dimercaptan polymer, etc., and similar polythiols which are conveniently and ordinarily synthesized on a commercial basis, although having obnoxious odors, are operable in this invention. Examples of the polythiol compounds preferred for this invention because of their relatively low odor level and fast curing rate include but are not limited to esters of thioglycolic acid (HS—$CH_2$COOH), α-mercaptopropionic acid (HS—CH($CH_3$)—COOH) and β-mercaptopropionic acid (HS—$CH_2CH_2$COOH) with polyhydroxy compounds such as glycols, triols, tetraols, pentaols, hexaols, etc. Specific examples of the preferred polythiols include but are not limited to ethylene glycol bis(thioglycolate), ethylene glycol bis(β-mercaptopropionate), trimethylolpropane, tris(thioglycolate), trimethylolpropane tris(β-mercaptopropionate), pentaerythritol tetrakis (thioglycolate) and pentaerythritol tetrakis (β-mercaptopropionate), all of which are commercially available. A specific example of a preferred polymeric polythiol is polypropylene ether glycol bisβ-mercaptopropionic acid by esterification.

The preferred polythiol compounds are characterized by a low level of mercaptanlike odor initially, and after reaction, give essentially odorless cured polythioether end products which are commercially useful resins or elastomers for printing plates.

As used herein the term "odorless" means the substantial absence of the well-known offensive and sometimes obnoxious odors that are characteristic of hydrogen sulfide and the derivative family of compounds known as mercaptans.

The term "functionality"as used herein refers to the average number of ene or thiol groups per molecule in the polyene or polythiol, respectively. For example, a triene is a polyene with an average of three "reactive" carbon to carbon unsaturated groups per molecule and thus has a functionality (*f.*) of 3. A polymeric dithiol is a polythiol with an average of two thiol groups per molecule and thus has a functionality (*f.*) of 2.

It is further understood and implied in the above definitions that in these systems, the functionality of the polyene and the polythiol component is commonly expressed in whole numbers although in practice the actual functionality may be fractional. For example, a polyene component having a nominal functionality of 2 (from theoretical considerations alone) may in fact have an effective functionality of somewhat less than 2. In an attempted synthesis of a diene from a glycol in which the reaction proceeds to 100 percent of the theoretical value for complete reaction, the functionality (assuming 100 percent pure starting materials) would be 2.0. If, however, the reaction were carried to only 95 percent of theory for complete reaction, about 10 percent of the molecules present would have only one ene functional group, and there may be a trace of material that would have no ene functional groups at all. Approximately 90 percent of the molecules, however, would have the desired diene structure and the product as a whole then would have an actual functionality of 1.9. Such a product is useful in the instant invention and is referred to herein as having a functionality of 2.

The aforesaid polyenes and polythiols can, if desired, be formed or generated in situ and still fall within the scope of the instant invention.

To obtain the maximum strength, solvent resistance, creep resistance, heat resistance and freedom from tackiness, the reaction components consisting of the polyenes and polythiols of this invention generally are formulated in such a manner as to give solid, cross-linked three dimensional network polythioether polymer systems on curing. In order to achieve such infinite network formation the individual polyenes and polythiols must each have a functionality of at least 2 and the sum of the functionalities of the polyene and polythiol components must always be greater than 4. Blends and mixtures of the polyenes and the polythiols containing said functionality are also operable herein.

In general, it is preferred, especially at or near the operable lower limits of functionality in the polyene and polythiol, to use the polythiol and the polyene compounds in such amounts that there is one thiol group present for each double bond, it being understood that the total functionality of the system must be greater than 4, and the functionality of the thiol and the diene must each be at least 2. For example, if two moles of a triene are used, and a dithiol is used as the curing agent, making the total functionality have a value of 5, it is preferable to use three moles of the dithiol. If much less than this amount of the thiol is used, the curing rate will be lower and the product will be weaker because of the reduced cross-link density. If much more than the stoichiometric amount of the thiol is used, the rate of cure may be higher, if that is desirable, although excessive amounts can lead to a plasticized cross-linked product which may not have the desired properties. However, it is within the scope of this invention to adjust the relative amounts of polyenes and polythiols to any values above the minimum scope disclosed herein which give desirable properties to the cross-linked polythioether.

The photocurable composition is blended with the vinyl plastic which is preferably in a powder form to form a plastisol, which is then coated thinly onto a flat substrate or to a flat support. This photocurable composition is then exposed imagewise to a radiation source containing a substantial amount of U.V. radiation, which causes the cross-linkage of the polyene and polythiol in the photocurable polymer composition to cross-link to form a tough, rubbery polymer filled with particles of the vinyl plastic. Useful U.V. radiation generally has a wavelength in the range of about 2,000 to 4,000 angstrom units. Then the entire film is heated to about 200° to 500° F. for a short period of time wherein the areas which were not photocured will flux, as the heat causes the curable polymer composition to plasticize the vinyl plastic. The result of the heat flux is a transparent, tough, plasticized, vinyl-plastic layer containing lightcured, hardened, photocured, polymer compositions in the areas which were exposed imagewise to the U.V.-containing radiation. When moistened with water, the heat-fluxed areas generally but not always show a greater affinity for water than do the U.V. radiation, photocured areas. The result is a lithographic printing plate having essentially a planographic printing surface.

The photocuring reaction can be initiated by U.V. radiation contained in actinic radiation from sunlight or obtained from special light sources which emit significant amounts of U.V. light. Useful U.V. radiation generally has a wave length in the range of about 2,000 to 4,000 angstrom units. Thus it is possible merely to expose the polyene and polythiol admixture to actinic radiation under ambient conditions or otherwise and obtain a cured solid elastomeric or resinous product useful as a printing plate material. But this approach to the problem results in extremely long exposure times which causes the process in the vast bulk of applications to be commercially unfeasible. Chemical photocuring rate accelerators (photoinitiators or -sensitizers or -activators, quinone, methyl ethyl ketone, etc.) serve to drastically reduce the image exposure time and thereby when used in conjunction with various forms of energetic radiation (containing U.V. radiation) yield very rapid, commercially practical photocures by the practice of the instant invention. Useful photocuring rate accelerators include benzophenone, acetophenone, acenapthene-quinone, methyl ethyl ketone, thioxanthen-9-one, xanthen-9-one, 7-H-Benz [de] anthracen-7-one, dibenzosuberone, 1-naphthaldehyde, 4,4'-bis (dimethylamino) benzophenone, fluorene-9-one, 1'-acetonaphthone, 2'acetonaphthone, 2,3-butanedione, anthraquione, 1-indanone, 2-tert-butyl anthraquinone, valerophenone, hexanophenone, 8-phenylbutyrophenone, ρ-mor pholinopropiophenone, 4-morpholinobenzophenone, 4'-morpholinodeoxybenzoin, p-diacetylbenzene, 4-aminobenzophenone, 4'-methoxyacetophenone benzaldehyde, α-tetralone, 9-acetylphenanthrene, 2-acetylphenanthrene, 10-thioxanthenone, 3-acetylphenanthrene, 3-acetylindole, 1,3,5-triacetylbenzene, etc. and blends thereof. The photoinitiators are added in amount ranging from about 0.005 to about 50 percent by weight of the polyene and polythiol components in the instant invention. Benzophenone is the preferred photocuring rate accelerator.

The coating of photocurable composition can be rather thick but the image quality is not as good as desired in lithographic printing. Therefore, the maximum coating thickness is about 0.03 inch; the minimum coating thickness about 0.00001 inch; and the preferred range is about 0.0003 to 0.006 inch.

The compositions to be photocured, i.e., converted to solid lithographic printing plates, in accord with the present invention may, if desired, include such additives as antioxidants, dyes, inhibitors, activators, fillers, pigments, antistatic agents, flame-retardant agents, thickness, thioxtropic agents, surface-active agents, light scattering agents, viscosity modifiers, extending oils, plasticizers, tackifiers and the like within the scope of this invention. Such additives are usually preblended with the polyene or polythiol prior to or during the compounding step. As in the case with any material which is added to the photocurable polymer composition useful within the scope of this invention, one should take care that it does not affect the oleophilic or hydrophilic characteristics thereof in a manner which is undesired. Operable fillers include natural and synthetic resins, carbon black, glass fibers, wood flour, clay, alumina, carbonates, oxides, hydroxides, silicates, glass flakes, glass beads, borates, phosphates, diatomaceous earth, talc, kaolin, barium sulfate, calcium sulfate, calcium carbonate, antimony oxide, colloidal carbon, titanium dioxide, barium sulfate, various colored pigments, various organophilic silicas, bentonites, colloidal silicas, powdered glass, and the like. The aforesaid additives may be present in quantities up to 500 parts or more per 100 parts photocurable composition by weight and preferably 0.005 to 300 parts on the same basis. The type and concentration of the additives must be selected with great care so that the final composition remains photocurable under practical conditions of exposure and with commercially feasible time cycles maintained throughout the operation. Additives which block out the passage of U.V. light or which detract from the stability of the photocurable composition must be avoided.

The compounding of the components prior to photocuring can be carried out in several ways. One useful method of compounding is prepared by conventional mixing techniques (but in absence of actinic radiation) a composition consisting of a polyene, a polythiol, a U.V. photoinitiator, and other inert additives. This composition generally can be stored in the dark for extended periods of time. Such a composition can be charged to an aerosol can, drum, tube, or cartridge for subsequent use.

In certain instances, for example, where the polyene is of an extremely high molecular weight, it may be desirable to use a solvent to compound the photocurable composition so that it may be readily compounded and spread upon a support layer. One can use a solvent suitable for such purposes. A suitable solvent is, for example, "Cellosolve"X acetate.

Conventional curing inhibitors or retarders operable in the instant invention include but are not limited to hydroquinone; P-tert-butyl catechol; 2,6-ditert-butyl-p-methylphenol phenothiazine and N-phenyl-2-napthylamine. The majority of the commercially available monomers and polymers used in the photocurable compositions normally contain minor amounts (about 50 to 5,000 parts per million by weight) of inhibitors to prevent spontaneous polymerization prior to use in making a printing plate. The presence of these inhibitors in optimum amounts causes no undesirable results in the photocurable layer of this invention.

The molecular weight of the polyenes of the instant invention can be measured by various conventional methods including solution viscosity, osmotic pressure and gel permeation chromatography. Additionally, the molecular weight can be sometimes calculated from the known molecular weight of the reactants. The viscosity of the polyenes and polythiols was measured on a Brookfield Viscometer at 30° or 70° C. in accord with the instructions therefor.

The photocurable composition at room temperature can vary from a liquid to a solid state, including a gel or elastomeric state. The photocurable composition may also contain a thickening agent to increase the viscosity of the photocurable liquid polymer and/or plastic vinyl. For example, cellulosic derivatives, finely divided silicas and finely ground fibrous asbestos materials may be used. The preferred photocurable compositions of the instant invention have viscosities in the range of about 0.25 to about 350 poises and preferably from about 5 to about 150 poises at a temperature not greater than about 70° C.

The vinyl plastic can be present in the photocurable composition in an amount ranging from about 33 parts by weight based upon 100 parts by weight of the other crucial ingredients, namely the polyene and the polythiol and the photocuring rate accelerator, to about 900 parts by weight. Although the preferred amount of plastic vinyl is about 80 parts by weight to about 400 parts by weight based upon 100 parts by weight of the other crucial ingredients in the photocurable composition.

The supporting base material, that is, the support employed, can be a natural of synthetic property capable of existence in film sheet or plate form and which is rigid although flexible to a certain extent when desired to be used as a suitable support in a lithographic printing procedure. The support can also be reflective or nonreflective of actinic light. Broadly, the support can be rubber, plastic, metal, paper, or glass. Plastics are preferably employed as a support. Suitable metals for a support include, but are not limited to steel, aluminum, magnesium and the like and may include curved aluminum. Additionally, the support layer can be the photocurable composition per se. That is, a portion of the photocurable composition can be poured into a mold and exposed directly to actinic light to solidify the entire layer of the photocurable composition. After solidification, this layer will serve as a support for an additional amount of the photocurable composition poured on top of the support, which additional amount would form the relief after exposure through an image-bearing transparency to actinic light.

As a support on which the photocurable composition is coated, there may be mentioned several types of substantially transparent films. Films composed of high polymers, e.g., polystyrene, polyamides, polyolefins, polyesters, vinyl polymers and cellulosics are quite suitable and in order for the above adhesive relationships to obtain these films may or may not contain an auxiliary layer to control anchorage. Specifically, the support can be composed of various film-forming plastics such as addition polymers, vinylidene polymers, e.g., vinyl chloride, vinylidene chloride copolymers with vinyl chloride, vinyl acetate, styrene, isobutylene and acrylonitrile; and vinylchloride copolymers with the latter polymerizable monomers; the linear condensation polymers such as the polyesters, e.g., polyethylene terephthalate; the polyamides, e.g., polyhexamethylene sebacamide; polyester amides, e.g., polyhexamethyleneadipamide/ adipate, and the like. Fillers or other reinforcing agents can be present in the synthetic resin or polymer support such as various fibers (synthetic, modified, or natural), e.g., cellulosic fibers, for instance, cotton, cellulose acetate, viscose rayon, paper; glass wool; nylon and the like. These reinforced bases may be used in laminated form.

When the support is highly reflective, e.g., aluminum, oblique rays of actinic light passing through the image bearing transparency and photocurable composition reflect off the support at such an angle as to cause curing in nonimage areas. To avoid this, a light absorptive layer is employed between the reflective support and the photocurable composition.

The light absorptive layer intermediate between the light-reflective support and the photocurable composition can be made from various materials. Suitable materials of this type are dyes and pigments. Pigments are preferred primarily because they do not bleed into the photocurable layer. In any event these materials must be unreactive with the photocurable layer. These light absorptive materials are preferably applied to the support in suspension in a polymer or resin capable of adhering to the support and the photocurable composition. Useful inorganic pigments for a light absorptive layer include iron oxide in various forms, e.g., Indian red, Venetian red, ocher, umber, sienna, iron black and the like; lead chromate, lead molybdate (chrome yellow and molybdenum orange); cadmium yellow, cadmium red, chromium green, iron blue, manganese black, various carbon blacks such as lamp black, furnace black, channel black and the like. Organic dyes soluble in the vehicles normally used in applying the light absorptive layer are best added as pigments in the form of lakes prepared by precipitating an insoluble salt of the dye on an inert, inorganic substrate. A list of such lakes and similar organic pigments is shown in "Printing and Litho Inks," J. H. Wolfe, pages 124–173, Fourth Edition, MacNair-Dorland and Co., New York (1949).

If a light-absorptive layer is employed as taught above, it must have adequate adhesion to the support and photocured layer. Said adhesion is usually supplied by suitable polymeric or resin carriers which include, but are not limited to, vinyl halides, e.g., polyvinyl chloride; vinyl copolymers particularly of vinyl halides, e.g., vinyl chloride with vinyl acetate, diethyl fumarate, ethyl acrylate, allyl glycidyl ether, glycidyl methacrylate; vinyl chloride/vinyl acetate/maleic anhydride copolymer; polyvinyl butyral; monomeric dimethylacrylate esters of the polyethylene glycols in combination with vinyl chloride copolymers; and styrene or diallyl phthalate with polyesters such as diethylene glycol maleate, diethylene glycol maleate/phthalate, triethylene glycol fumarate/sebacate, and the like.

A top cover or protective cover may be placed upon the photocurable composition to protect the cover from damage during storage and prior to usage. This cover is preferably stripped away from the photocurable composition before exposure to radiation. It is preferred that this top cover since it is to be stripped away normally before exposure of the plate that said top cover have a very low adhesion to the photocurable composition so that the parts of the photocurable composition are not removed when the cover is peeled away from the rest of the photocurable element. This top cover is incidental and may be made from any convenient material.

It is important to select the correct exposure time in the photocuring process of this invention. That is, in making lithographic printing plates, it is essential that the exposure be sufficient to harden the photocurable composition in the exposed image areas without causing significant curing in the nonimage areas. Aside from exposure time and light intensity, the extent of the exposure is dependent on the thickness of the photocurable layer, the curing temperature, the structure and functionally of the polyene and polythiol employed, the photoinitiator type and concentration, the photocuring rate, the presence of light absorbing pigments or dyes in the photocurable composition, and the character of the image to be reproduced. In general, the thicker the layer to be photocured, the longer the exposure time. It has been observed that photocuring starts at the surface of the photocurable layer closest to the light source and proceeds downward to the support. Inasmuch as the photocuring rate usually increases at higher temperatures. less exposure is required thereat than at room temperature. Thus ultraviolet light sources that emit heat, or the concurrent use of an infrared lamp with the U.V. lamp, etc., are more efficient than cold ultraviolet light sources. However, care must be exercised that too high a temperature is not attained during the photocure, as this leads to, in some cases, thermal expansion of the photocurable composition which results in image distortion. Hence, it is preferred that the photocuring be carried out at a temperature in the range of about 20° to 70° C. Due to the number of variables which affect exposure time, optimum results are best determined by trail and error, e.g., stepped exposures with characterization after each exposure.

Photocured images can also be prepared by the instant invention by projection through a suitable lens system.

When using a broad light source such that oblique rays are emitted, even a thin top cover between the surface of the transparency and the photocurable layer causes some broadening of the image. This top cover is only a protective layer and must be transparent itself if the exposure is through it. Ordinarily this has very little effect except in the preparation of halftone or line plates with fine lines. Such plates are best prepared with the negatives directly in contact with the outer surface of the photocurable layer or the top cover, except, in the latter case, for a thin layer of a parting agent such as silicone oil. For this reason, a point or collimated light source is preferred. In this latter case, an air gap can be employed between the outer surface of the photocurable layer or the top cover and the surface of the image bearing transparency, stencil, etc.

A suitable apparatus for exposure of the photocurable element is given in a copending application having Ser. No. 674,773, inventors: Werber, Wszolek, and Kehr, filed: Oct. 12, 1967, and assigned to the same assignee.

Various light sources can be used to obtain sufficient U.V. light to practice the instant invention. Such sources include carbon arcs, mercury arcs, fluorescent lamps with special ultraviolet light emitting phosphors, xenon arcs, argon glow lamps, photographic flood lamps. Of these, the mercury vapor arcs, particularly the sunlamp type, and xenon arcs are very useful. The sunlamp mercury vapor arcs are customarily used at a distance of seven to 10 inches from the photocurable layer, whereas the xenon arc is placed at a distance of 24 to 40 inches from the photocurable layer. With a more uniform extended source of low intrinsic brilliance, such as a group of contiguous fluorescent lamps with special phosphors, the plate can be exposed within an inch of the lamps.

For liquid photocurable compositions, it is preferred that the light emanate from a point source photocurable in the form of parallel rays but divergent beams are also operable as a source of actinic light in the instant invention. An air gap can be maintained between the photocurable element and the image-bearing transparency. Such an air gap can range in width up to about 250 mils or more.

It should be noted that if a liquid photocurable composition or a not too viscous photocurable composition is used as in the photocurable layer, that the resultant photocurable layer if liquid should be accompanied by a top cover to prevent movement and damage of said photocurable layer. Therefore, a solid, or what would be termed nearly solid, photocurable layer or plastisol should be utilized. Most photocurable compositions which are liquid are converted into an extremely viscous substance by the addition of the vinyl plastic in a fine-particle form. The vinyl plastic, preferably, should be used in a powder from wherein the average particle size is within the range of about 0.01 microns to about 2,000 microns and preferably the average particle size should be within the range of about 0.1 micron to 250 microns.

The vinyl plastic should be heat-fluxed at a temperature within the range of about 200° to about 500° F. The preferable heat-fluxing temperature is about 250° F.–350° F. The entire photocurable element should be subjected to the heat which means that the preferred type of heat-fluxing occurs in a device, such as, an oven, wherein the entire photocurable composition can be subjected to the temperature. The period of heat-fluxing should range from about 15 seconds to about 15 minutes. It is during this period of heat-fluxing that the uncured photocurable composition acts as a plasticizer to flux the vinyl plastic. The result is a tough, flexible, insoluble layer of plasticized vinyl plastic.

One advantage of the instant invention is that the line and halftone lithographic printing plates can be made very easily and rapidly. A convenient method to carry out the process of this invention is to place image-bearing, line and halftone, stencil, negative or positive transparency parallel to the surface of the photocurable composition or the top cover of the photocurable element. The image-bearing transparency and the surface of the photocurable composition or transparent top cover can be in contact or have an air gap therebetween as desired. The photocurable layer is exposed through the transparency to a source of actinic light, preferably a point or collimated light source when a liquid photocurable composition is used, until the photocurable layer is photocured to an insoluble state in the exposed areas. If the photocurable composition is a solid under atmospheric conditions, the composition can be precast at elevated temperatures in liquid form to any desired thickness and thereafter solidified. If the photocurable composition is liquid at room temperatures, it can be placed in a frame or a molded bottom support and poured into said mold, etc. and any excess removed with a doctor blade or similar means and thereafter, if necessary, have a top protective cover attached thereon.

The photocurable liquid compositions of the instant invention prior to photocuring can readily be pumped, poured, siphoned, brushed, sprayed, doctored, rolled, trowelled, dip-coated, extruded or gunned into place into cavities, molds, or onto vertical or horizontal flat surfaces in a uniform fashion.

The liquid polythiolether photocurable components and compositions in the instant invention can, prior to curing, be admixed with or blended with other monomeric and polymeric materials, such as, thermoplastic resins, elastomers, or thermosetting resin monomers or polymeric compositions. The resultant blend can then be subjected to conditions for curing or occuring the various components of the blend to give the cured products the necessary physical properties to make it more oleophilic or relatively hydrophilic as desired.

Before use as a lithographic printing plate, the lithographic printing plate is often wetted with water containing a water soluble colloid, such as, gum arabic, or other water soluble hydrophilic colloids or other surface active agents, to improve the hydrophilic-oleophilic (hydrophilic characteristics of the surface). Once placed upon a lithographic printing press, the printing plate surface is dampened and subsequently inked, and then the printing plate surface is applied against the surface upon which you wish to print or transfer the image to. The wetting material can be water or any useful lithographic fountain solution. The fountain solution used in offset lithographic printing operations normally contains some acid and desensitizing compound so as to keep the nonprinting areas clean during long runs—this prevents the transfer of ink to the hydrophilic surface areas. The pH of the fountain solution can often be as high as 5 to 6. Wetting agents may also be found in conventional fountain solution in carefully controlled quantities.

The useful lithographic inks cover the span of the conventional lithographic inks. In general, a useful lithographic ink is basically a concentrated dispersion of pigment in a viscous oil vehicle, with various additives to give it suitable working properties. These various additives include such things as a dryer to accelerate hardening after printing, or a resin desolved in a volatile solution which evaporates upon being printed out.

A general discussion of the background of lithography and the various techniques of lithographic printing, such as, direct and offset lithography or single impressions with re-inking and the various types of lithographic ink, inking rollers and offset blankets, etc. are found in Kirk-Othmer, "Encyclopedia of Chemical Technology," volume 11, pages 129–140 (1953).

The following examples will aid in explaining, but should not be deemed as limiting, the instant invention. In all cases, unless otherwise noted, all parts and percentages are by weight.

EXAMPLE 1

546 gms. of "S–102–100" (which is a polyester glycol and is commercially available from Hooker Chemical Co.) and 0.1 cc. of DBDTL (which is dibutyltindilaurate and is commercially available from Carlisle Chemical Co.) were placed in a 1-liter, four-necked flask. The material was heated in the flask to 110° C., under vacuum and nitrogen, and maintained at said conditions for 1hour. The material in the flask was then cooled to about 60° C. 83gms. of allyl isocyanate were placed in a dropping funnel and then added to the reaction at a moderate rate. It took 20 minutes to heat the material initially from room temperature to 110° and it took 30 minutes to cool the composition in the flash from 100 ° C. to 60° C. The allyl isocyanate addition took about 30 minutes. The temperature at the end of the allyl isocyanate addition was 90° C. The reaction was continued for 1 hour at the end of which period, the temperature of the material was 70° C. At that point 20 ccs. of methanol were added and stirred into the reaction. After 10 minutes, the temperature of the material was 70° C. and the reaction was shut down.

A paste was prepared by admixing 100 gms. of polymer A, 6.5 gms. of pentaerythritol tetrakis (β-mercaptopropionate), 0.5 gm. of benzophenone and 100 gms. of vinyl plastic A. Vinyl plastic A was a homopolymer of vinyl chloride having an inherent viscosity of 1.10 (a paste-making grade) and which is commercially available from Goodyear Tire and Rubber Co. under the trade name "Pliovic WO–2." The admixture was warmed to 50° C., spread on an aluminum plate (to give a 5-mil-thick layer) and cooled, whereupon a solid, photocurable layer was obtained. The photocurable layer was exposed through a line negative to a Sylvania 275 watt Sunlamp for 3 minutes at a distance of 1 foot. The imagewise, exposed, photocurable element was placed in an oven, heated to 250° C. for 1 minute, and cooled. The photocurable layer contained a clear coating of thermally-fluxed polyvinyl chloride with photocured, white-colored, non-fluxed, photocured areas corresponding to the imagewise exposure. The photocured areas were relatively oleophilic and the remaining thermally-fluxed areas were relatively hydrophilic.

EXAMPLE 2

The processed element of example 1 was placed on the plate cylinder of an offset rotary lithographic printing plate, wetted and inked, and used to print accurate impressions or copies corresponding to the image on the original negative.

EXAMPLE 3

Example 1 was repeated, except that the element was heat fluxed at 300° F. for 5 minutes.

EXAMPLE 4 Example was repeated, except that 107 gms. of vinyl plastic A (polyvinyl chloride) were admixed with polymer A. The processed element was then placed on the plate cylinder of an offset rotary lithographic printing plate, wetted and inked, and used to print accurate impressions (copies).

EXAMPLE 5

Example 3 was repeated, except that a halftone negative transparency was used in place of the line negative transparency. A lithographic printing place resulted, with the image exposed areas of the plate being oleophilic and the unexposed areas being hydrophilic.

EXAMPLE 6

Example 3 was repeated, except that 8.5 grams of trimethylolpropane tris (β-mercaptopropionate) was used in place of pentaerythritol tetrakis (β-mercaptopripionate). A lithographic printing plate resulted, with the image exposed areas of the plate being oleophilic and the unexposed areas being hydrophilic.

EXAMPLE 7

Example 3 was repeated, except that half of the pentaerythritol tetrakis (β-mercaptopropionate) was replaced with 15 grams of ethylene glycol bis (β-mercaptopropionate). A lithographic printing plate resulted, with the image exposed areas of the plate being oleophilic and the unexposed areas being hydrophilic.

EXAMPLE 8

Example 3 was repeated, except that 10 grams of trimethylolpropane tris(thioglycolate) was used in place of pentaerythritol tetrakis (β-mercaptopropionate), and that a halftone positive was used in place of the line negative. A lithographic printing plate resulted;

EXAMPLE 9

Example 3 was repeated, except that5 grams of polypropylene ether glycol bis (β-mercaptopropionate) was used in place of pentaerythritol tetrakis (β-mercaptopropionate). A lithographic printing plate resulted, with the image exposed areas of the plate being oleophilic and the unexposed areas being hydrophilic.

EXAMPLE 10

Example 3 was repeated, except that 100 grams of pentaerythritol tetrakis (thioglycolate) was used in place of pentaerythritol tetrakis (β-mercaptopropionate). A lithographic printing plate resulted, with the image exposed areas of the plate being oleophilic and the unexposed areas being hydrophilic.

EXAMPLE 11

Example 3 was repeated, except that a copolymer of vinyl chloride and vinylidene chloride (60:40) was used in place of the homopolymer of vinyl chloride. A lithographic printing plate resulted, with the image exposed areas of the plate being oleophilic and the unexposed areas being hydrophilic.

EXAMPLE 12

Example 3 was repeated, except that H100 grams of a homopolymer, of ethyl acrylate was used in place of the homopolymer of vinyl chloride. A lithographic printing plate resulted, with the image exposed areas of the plate being oleophilic and the unexposed areas being hydrophilic.

EXAMPLE 13

Example 3 was repeated, except that 75 grams of homopolymer of methyl acrylate was used in place of the homopolymer of vinyl chloride. A lithographic printing plate resulted, with the image exposed areas of the plate being oleophilic and the unexposed areas being hydrophilic.

EXAMPLE 14

Example 3 was repeated, except that 75 grams of a homopolymer of hexyl acrylate was used in place of the homopolymer of vinyl chloride. A lithographic printing plate resulted, with the image exposed areas of the plate being oleophilic and the unexposed areas being hydrophilic.

EXAMPLE 15

Example 3 was repeated, except that 50 grams of a homopolymer of acrylamide copolymer was used in place of the homopolymer of vinyl chloride. A lithographic printing plate resulted, with the image exposed areas of the plate being oleophilic and the unexposed areas being hydrophilic.

EXAMPLE 16

Example 3 was repeated, except that 50 grams of a homopolymer of acrylonitrile was used in place of the homopolymer of vinyl chloride. A lithographic printing plate resulted, with the image exposed areas of the plate being oleophilic and the unexposed areas being hydrophilic.

EXAMPLE 17

Example 3 was repeated, except that 50 grams of a homopolymer of calcium acrylate was used in place of the homopolymer of vinyl chloride. A lithographic printing plate resulted, with the image exposed areas of the plate being oleophilic and the unexposed areas being hydrophilic.

EXAMPLE 18

Example 3 was repeated, except that 100 grams of a homopolymer of ethylene acrylate was used in place of the homopolymer of vinyl chloride. A lithographic printing plate resulted, with the image exposed areas of the plate being oleophilic and the unexposed areas being hydrophilic.

EXAMPLE 19

Example 3 was repeated, except that 100 grams of a homopolymer of allyl acrylate was used in place of the homopolymer of vinyl chloride. A lithographic printing plate resulted, with the image exposed areas of the plate being oleophilic and the unexposed areas being hydrophilic.

EXAMPLE 20

Example 3 was repeated, except that 50 grams of a homopolymer of N-isopropylmethacrylamide was used in place of the homopolymer of vinyl chloride. A lithographic printing plate resulted, with the image exposed areas of the plate being oleophilic and the unexposed areas being hydrophilic.

EXAMPLE 21

Example 3 was repeated, except that 75 grams of a homopolymer of methyl methacrylate was used in place of the homopolymer of vinyl chloride. A lithographic printing plate resulted, with the image exposed areas of the plate being oleophilic and the unexposed areas being hydrophilic.

EXAMPLE 22

Example 3 was repeated, except that 75 grams of a homopolymer of isopropyl methacrylate was used in place of the homopolymer of vinyl chloride. A lithographic printing plate resulted, with the image exposed areas of the plate being oleophilic and the unexposed areas being hydrophilic.

EXAMPLE 23

Example 3 was repeated, except that 50 grams of a homopolymer of ethyl methacrylate was used in place of the homopolymer of vinyl chloride. A lithographic printing plate resulted, with the image exposed areas of the plate being oleophilic and the unexposed areas being hydrophilic.

EXAMPLE 24

Example 3 was repeated, except that 75 grams of a homopolymer of vinyl benzoate was used in place of the homopolymer of vinyl chloride. A lithographic printing plate resulted, with the image exposed areas of the plate being oleophilic and unexposed areas being hydrophilic.

EXAMPLE 25

Example 3 was repeated, except that 75 grams of a homopolymer of vinyl formate was used in place of the homopolymer of vinyl chloride. A lithographic printing plate resulted, with the image exposed areas of the plate being oleophilic and the unexposed areas being hydrophilic. EXAMPLE 26

Example 3 was repeated, except that 100 grams of a homopolymer of 2-chloroallyl acrylate was used in place of the homopolymer of vinyl chloride. A lithographic printing plate resulted, with the image exposed areas of the plate being oleophilic and the unexposed areas being hydrophilic.

EXAMPLE 27

Example 3 was repeated, except that 100 grams of a homopolymer of the 1,3-dimethylbutyl acrylate of menthol was used in place of the homopolymer of vinyl chloride. A lithographic printing plate resulted, with the image exposed areas of the plate being oleophilic and the unexposed areas being hydrophilic.

EXAMPLE 28

Example 3 was repeated, except that 100 grams of a homopolymer of 2-methoxyethyl acrylate was used in place of the homopolymer of vinyl chloride. A lithographic printing plate resulted, with the image exposed areas of the plate being oleophilic and the unexposed areas being hydrophilic.

EXAMPLE 29

Example 3 was repeated, except that 50 grams of a homopolymer of N-vinyl indole was used in place of the homopolymer of vinyl chloride. A lithographic printing plate resulted, with the image exposed areas of the plate being oleophilic and the exposed areas being hydrophilic.

EXAMPLE 30

Example 3 was repeated, except that 100 grams of a homopolymer of vinyl bromide was used in place of the homopolymer of vinyl chloride. A lithographic printing plate resulted, with the image exposed areas of the plate being oleophilic and the unexposed areas being hydrophilic.

EXAMPLE 31

Example 3 was repeated, except that 100 grams of a homopolymer of vinyl fluoride was used in place of the homopolymer of vinyl chloride. A lithographic printing plate resulted, with the image exposed areas of the plate being oleophilic and the unexposed areas being hydrophilic.

EXAMPLE 32

Example 3 was repeated, except that 100 grams of a homopolymer of vinyl iodide was used in place of the homopolymer of vinyl chloride. A lithographic printing plate resulted, with the image exposed areas of the plate being oleophilic and the unexposed areas being hydrophilic.

EXAMPLE 33

Example 3 was repeated, except that 100 grams of a homopolymer of vinyl alcohol was used in place of the homopolymer of vinyl chloride. A lithographic printing plate resulted, with the image exposed areas of the plate being oleophilic and the unexposed areas being hydrophilic.

EXAMPLE 34

Example 3 was repeated, except that 100 grams of a homopolymer of 2-vinyl pyridine was used in place of the homopolymer of vinyl chloride. A lithographic printing plate resulted, with the image exposed areas of the plate being oleophilic and the unexposed areas being hydrophilic.

EXAMPLE 35

Example 3 was repeated, except that 100 grams of a homopolymer of acrolein was used in place of the homopolymer of vinyl chloride. A lithographic printing plate resulted, with the image exposed areas of the plate being oleophilic and the unexposed areas being hydrophilic.

EXAMPLE 36

Example 3 was repeated, except that 100 grams of a homopolymer of styrene was used in place of the homopolymer of vinyl chloride. A lithographic printing plate resulted, with the image exposed areas of the plate being oleophilic and the unexposed areas being hydrophilic.

EXAMPLE 37

Example 3 was repeated, except that 100 grams of a copolymer of acrylonitrile and styrene was used in place of the homopolymer of vinyl chloride. A lithographic printing plate resulted, with the image exposed areas of the plate being oleophilic and the unexposed areas being hydrophilic.

EXAMPLE 38

Example 3 was repeated, except that 100 grams of a homopolymer of acrylonitrile and vinyl chloride was used in place of the homopolymer of vinyl chloride. A lithographic printing plate resulted, with the image exposed areas of the plate being oleophilic and the unexposed areas being hydrophilic.

EXAMPLE 39

Example 3 was repeated, except that 50 grams of a homopolymer of acrylonitrile and vinylidene chloride (50:50) was used in place of the homopolymer of vinyl chloride. A lithographic printing plate resulted, with the image exposed areas of the plate being oleophilic and the unexposed areas being hydrophilic.

EXAMPLE 40

Example 3 was repeated, except that 75 grams of a copolymer of styrene and methacrylate (50:50) was used in place of the homopolymer of vinyl chloride. A lithographic printing plate resulted, with the image exposed areas of the plate being oleophilic and the unexposed areas being hydrophilic.

EXAMPLE 41

Example 3 was repeated, except that 100 grams of a terpolymer of acrylonitrile, styrene and vinylpyridine (1/3:1/3:1/3) was used in place of the homopolymer of vinyl chloride. A lithographic printing plate resulted, with the image exposed areas of the plate being oleophilic and the unexposed areas being hydrophilic.

EXAMPLE 42

Example 3 was repeated, except that 120 grams of 50:50 blend of poly(acrylic acid) and poly(vinyl alcohol) was used in place of the homopolymer of vinyl chloride. A lithographic printing plate resulted, with the image exposed areas of the plate being oleophilic and the unexposed areas being hydrophilic.

EXAMPLE 43

Example 3 was repeated except that 60 grams of polymer C was used in place of polymer A. Polymer C was prepared as follows: 1 mole of commercially available poly (ethylene ether) glycol having a molecular weight of 1,450 and a specific gravity of 1.21 was charged to a resin kettle maintained under nitrogen and equipped with a condenser, stirrer, thermometer and a gas inlet and outlet. 2.9 gms. dibutyl tin dilaurate as a catalyst was charged to the kettle along with 2 moles tolylene-2,4-diisocyanate and 2 moles of allyl alcohol. The reaction was continued with stirring at 60° C. for 2 hours. Thereafter a vacuum of 1 mm. was applied for 2 hours at 60° C. to remove the traces of excess alcohol. This CH2=CH–terminated polymer had a molecular weight of approximately 1,950 and was labeled polymer C.

A lithographic printing plate resulted, with the image exposed areas of the plate being hydrophilic and the unexposed areas being oleophilic.

EXAMPLE 44

Example 43 was repeated, except that 100 grams of a homopolymer of ethylene was used in place of the homopolymer of vinyl chloride. A lithographic printing plate resulted, with the image exposed areas of the plate being hydrophilic and the unexposed areas being oleophilic.

EXAMPLE 45

Example 3 was repeated except that 60 grams of polymer B was used in place of polymer A. Polymer B was prepared as follows: 458 gms. (0.23 moles) of a commercially available liquid polymeric diisocyanate sold under the trade name "Adiprene L–100" by E. I. duPont De Nemours & Co. was charged to a dry resin kettle maintained under a nitrogen atmosphere and equipped with a condenser, stirrer, thermometer, and gas inlet and outlet. 37.8 gms. (0.65moles) of allyl alcohol was charged to the kettle and the reaction was continued for 17 with stirring at 100° C. Thereafter the nitrogen atmosphere was removed and the kettle was evacuated 8 hours at 100° C. 50 cc. dry benzene was added to the kettle and the reaction product was azeotroped with benzene to remove the unreacted alcohol. This allyl-terminated liquid polymer has a molecular weight of approximately 2,100 and was labeled polymer B.

A lithographic printing plate resulted, with the image exposed areas of the plate being oleophilic and the unexposed areas being hydrophilic.

EXAMPLE 46

Example 3 was repeated, except that 100 grams of polymer D was used in place of polymer A. Polymer D was prepared as follows: To a 1-liter resin kettle equipped with stirrer, thermometer, gas inlet and outlet and heated to a temperature of 50° C. was charged 610 gms. (0.2 mole) of polytetramethylene ether glycol, commercially available from Quaker Oats Co. and having a hydroxyl number of 37.1 and a molecular weight of 3,000, along with 0.3 gm. dibutyl tin dilaurate. The temperature of the kettle was raised to 110° C. and the contents were freed of water under 1 millimeter vacuum for 1 hour. The resin kettle was cooled to 60° C. and the system was placed under a protective atmosphere of nitrogen throughout the remainder of the reaction. 34.0 gms. of allyl isocyanate, (0.4 mole) was added dropwise to the kettle at such a rate as to maintain the temperature at 60° C. When the NCO content dropped to 0.54 mg./gm., 1 mm. vacuum again was applied and the system was heated at 70° C. for 1 hour. The thus formed polymer product was a solid at room temperature but at 50° C. is clear and pourable. The polymer product has a viscosity of 1,800 centipoises at 70° C. as measured on a Brookfield Viscometer and an average molecular weight of approximately 3,200 and was labeled polymer D.

A lithographic printing plate resulted with the image exposed areas of the plate being oleophilic and the unexposed areas being hydrophilic.

EXAMPLE 47

Example 3 was repeated except that 100 grams of polymer E was used in place of polymer A. Polymer E was prepared as follows: 1,500 gms. (0.47 moles) of a linear solid polyester diol having a molecular weight of 3,200 and commercially available from Hooker Chemical Corp. under the trade name "Rucoflex S 1011 35" was charged to a 3-liter, three-necked flask heated to 110° C. under vacuum and nitrogen for 1 hour with stirring. 83 gms. of allyl isocyanate having a molecular weight of 83.1 and commercially available from Upjohn Co. was added to the flask along with 0.3 cc. of dibutyl tin dilaurate (catalyst), commercially available from J. T. Baker. The reaction was continued at 110° C. with stirring for 1 hour. This allyl-terminated was labeled polymer E.

A lithographic printing plate resulted, with the image exposed areas of the plate being oleophilic and the unexposed areas being hydrophilic.

EXAMPLE 48

Example 3 was repeated except that 100 grams of polymer F was used in place of polymer A. Polymer F was prepared as follows: 1,500 gms. (0.48 moles) of a commercially available linear solid polyester diol, sold under the trade name "S–106" by Hooker Chemical Corp., was charged to a 3-liter flask equipped with stirrer and heated to 110° C. under vacuum and nitrogen. After 1 hour at that temperature, it was cooled to about 60° C. whereat 81 gms. of allyl isocyanate was slowly added by means of a dropping funnel along with 0.3 cc. of dibutyl tin dilaurate. The mixture was stirred for 1 hour at a temperature in the range 70–80° C. This allyl-terminated polymer was labeled polymer F.

A lithographic printing plate with the image exposed areas of the plate being oleophilic and the unexposed areas being hydrophilic.

EXAMPLE 49

Example 3 was repeated except that 100 grams of polymer G was used in place of polymer A. Polymer G was prepared as follows: 300 gms. (0.097 moles) of a commercially available linear solid polyester diol, sold under the trade name "S–108" by Hooker Chemical Co., along with 0.1 cc. of dibutyl tin dilaurate were charged to a 1-liter four-necked flask equipped with stirrer. The mixture was heated to 110° C. under vacuum and nitrogen and maintained thereat for 1 hour. The mixture was then cooled to 60° C. whereat 16 gms. of allyl isocyanate was added and the mixture was heated to 75° C. with stirring and maintained thereat for 1 hour. This allyl-terminated polymer was labeled polymer G.

A lithographic printing plate resulted, with the image exposed areas of the plate being oleophilic and the unexposed areas being hydrophilic.

EXAMPLE 50

Example 3 was repeated except that 65 grams of polymer H was used in place of polymer A. Polymer H was prepared as follows: 240 gms. (0.12 moles) of a polyether diol, i.e., poly tetramethylene oxide), having a molecular weight of 1,990 commercially available from the Quaker Oats Co. under the trade name "Polymeg 199o," were charged to a 500 ml. three-necked flask equipped with stirrer. The flask was heated to 110° C. under vacuum and nitrogen and maintained thereat for 1 hour. The flask was then cooled to approximately 70° C. whereat 0.1 cc. of dibutyl tin dilaurate along with 14 gms. (0.25 moles) of allyl alcohol were added to the flask and stirring was continued for 15 minutes. Thereafter 42 gms. (0.24 moles) of tolylene diisocyanate (molecular weight 174) commercially available from Mobay Chemical Co. under the trade name "Mondur TD–80" was added to the flask by means of a dropping funnel and the reaction was continued with stirring for 1 hour. This allyl-terminated polymer was labeled polymer H.

A lithographic printing plate resulted, with the image exposed areas of the plate being oleophilic and the unexposed areas being hydrophilic.

EXAMPLE 51

Example 3 was repeated except that 100 grams of polymer I was used in place of polymer A. Polymer I was prepared as follows: 600 gms. (0.11 moles) of a polypropylene glycol called under the trade name "Triol 6000" by Union Carbide Corp. was charged to a 1-liter resin kettle along with 0.3 gm. of dibutyl tin dilaurate. The kettle was heated to 110° C. under vacuum and maintained thereat for 1 hour. The kettle was then cooled to approximately 50° C. whereat 28.4 gms. (0.342 moles) of allyl isocyanate was added slowly to keep the exotherm between 60–67° C. NCO content after 20 minutes was 0.62 mg. NCO/gm. This polymer was then placed under vacuum at 70° C. for 1 hour followed by an additional vacuuming at 90° C. for 2 hours. This allyl-terminated polymer was labeled polymer I.

A lithographic printing plate resulted, with the image exposed areas of the plate being oleophilic and the unexposed areas being hydrophilic.

EXAMPLE 52

Example 3 was repeated except that 60 grams of polymer J was used in place of polymer A. Polymer J was prepared as follows: 600 gms. (0.22 mol) of a polypropylene glycol having a molecular weight of 2,960 and under the trade name "Triol 3,000" by Union Carbide Corp. was charged to a 1-liter resin kettle along with 0.3 gm. of dibutyl tin dilaurate. The kettle was heated to 110° C. under vacuum and maintained thereat for 1 hour. The kettle was cooled to 60° C. whereat 40 gms. (0.48 mole) of allyl isocyanate was added dropwise from a dropping funnel to the reaction mixture. After 20 minutes the NCO content was 0.80 mg. NCO/gm. The thus formed prepolymer was then maintained under vacuum at 70° C. for 1 hour followed by 2 hours at 90° C. This allyl-terminated polymer was labeled polymer J.

A lithographic printing plate resulted, with the image exposed areas of the plate being oleophilic and the unexposed areas being hydrophilic.

EXAMPLE 53

Example 3 was repeated except that 1 grams cyclohexanone was used as the photoinitiator in place of benzophenone. A lithographic printing plate resulted, with the image exposed areas of the plate being oleophilic and the unexposed areas being hydrophilic.

EXAMPLE 54

Example 3 was repeated except that 2 grams of acetone was used as the photoinitiator in place of benzophenone. A lithographic printing plate resulted, with the image exposed areas of the plate being oleophilic and the unexposed areas being hydrophilic.

EXAMPLE 55

Example 3 was repeated except that 2 grams of methyl ethyl ketone was used as the photoinitiator in place of benzophenone. A lithographic printing plate resulted, with the image exposed areas of the plate being oleophilic and the unexposed areas being hydrophilic.

EXAMPLE 56

Example 3 was repeated, except that 75 grams of a homopolymer of isopropyl acrylate was used in place of the homopolymer of vinyl chloride. A lithographic printing plate resulted, with the image exposed areas of the plate being oleophilic and the unexposed areas being hydrophilic.

EXAMPLE 57

Example 3 was repeated, except that 75 grams of a homopolymer of ethyl acrylate was used in place of the homopolymer of vinyl chloride. A lithographic printing plate resulted, with the image exposed areas of the plate being oleophilic and the unexposed areas being hydrophilic.

EXAMPLE 58

Example 3 was repeated, except that 100 grams of a homopolymer of 2-ethylhexyl acrylate was used in place of the homopolymer of vinyl chloride. A lithographic printing plate resulted, with the image exposed areas of the plate being oleophilic and the unexposed areas being hydrophilic.

EXAMPLE 59

Example 3 was repeated, except that 100 grams of a homopolymer of sodium acrylate was used in place of the homopolymer of vinyl chloride. A lithographic printing plate resulted, with the image exposed areas of the plate being oleophilic and the unexposed areas being hydrophilic.

EXAMPLE 60

Example 42 was repeated, except that 100 grams of a homopolymer of propylene was used in place of the homopolymer of vinyl chloride. A lithographic printing plate resulted, with the image exposed areas of the plate being hydrophilic and the unexposed areas being oleophilic.

EXAMPLE 61

Example 3 was repeated, except that 100 grams of a homopolymer of tert-butyl methacrylate was used in place of the homopolymer of vinyl chloride. A lithographic printing plate resulted, with the image exposed areas of the plate being oleophilic and the unexposed areas being hydrophilic.

EXAMPLE 62

Example 3 was repeated, except that 100 grams of a copolymer of vinyl chloride (90 parts) and propylene (10 parts) was used in place of the homopolymer of vinyl chloride. A lithographic printing plate resulted, with the image exposed areas of the plate being oleophilic and the unexposed areas being hydrophilic.

EXAMPLE 63

Example 3 was repeated, except that 75 grams of a homopolymer of ethanolamine was used in place of the homopolymer of vinyl chloride. A lithographic printing plate resulted, with the image exposed areas of the plate being oleophilic and the unexposed areas being hydrophilic.

EXAMPLE 64

Example 3 was repeated, except that 75 grams of a homopolymer of p-vinyl benzyl alcohol was used in place of the homopolymer of vinyl chloride. A lithographic printing plate resulted, with the image exposed areas of the plate being oleophilic and the unexposed areas being hydrophilic.

EXAMPLE 65

Example 3 was repeated, except that 100 grams of a homopolymer of vinyl phenyl ether was used in place of the homopolymer of vinyl chloride. A lithographic printing plate resulted, with the image exposed areas of the plate being oleophilic and the unexposed areas being hydrophilic.

EXAMPLE 66

Example 3 was repeated, except that 100 grams of a homopolymer of $CH2{=}CBr_2$ was used in place of the homopolymer of vinyl chloride. A lithographic printing plate resulted, with the image exposed areas of the plate being oleophilic and the unexposed areas being hydrophilic.

EXAMPLE 67

Example 3 was repeated, except that 100 grams of a homopolymer of CH2 CBrF was used in place of the homopolymer of vinyl chloride. A lithographic printing plate resulted, with the image exposed areas of the plate being oleophilic and the unexposed areas being hydrophilic.

EXAMPLE 68

Example 3 was repeated, except that 100 grams of a homopolymer of CF2=CHF was used in place of the homopolymer of vinyl chloride. A lithographic printing plate resulted, with the image exposed areas of the plate being oleophilic and the unexposed areas being hydrophilic.

EXAMPLE 69

Example 3 was repeated, except that 100 grams of a homopolymer of CF2=CHCl was used in place of the homopolymer of vinyl chloride. A lithographic printing plate resulted with the image exposed areas of the plate being oleophilic and the unexposed areas being hydrophilic.

EXAMPLE 70

Example 3 was repeated, except that 100 grams of a homopolymer of 2,4-dimethylstyrene was used in place of the homopolymer of vinyl chloride. A lithographic printing plate resulted, with the image exposed areas of the plate being oleophilic and the unexposed areas being hydrophilic.

EXAMPLE 71

Example 3 was repeated, except that 100 grams of a homopolymer of 2,5-dimethylstryrene was used in place of the homopolymer of vinyl chloride. A lithographic printing plate resulted, with the image exposed areas of the plate being oleophilic and the unexposed areas being hydrophilic.

EXAMPLE 72

Example 3 was repeated, except that 100 grams of a homopolymer of p-isopropylstyrene was used in place of the homopolymer of vinyl chloride. A lithographic printing plate resulted, with the image exposed areas of the plate being oleophilic and the unexposed areas being hydrophilic.

EXAMPLE 73

Example 3 was repeated, except that 100 grams of a homopolymer of p-cyclohexylstyrene was used in place of the homopolymer of vinyl chloride. A lithographic printing plate resulted, with the image exposed areas of the plate being oleophilic and the unexposed areas being hydrophilic.

EXAMPLE 74

Example 3 was repeated, except that 100 grams of a homopolymer of m-methoxystyrene was used in place of the homopolymer of vinyl chloride. A lithographic printing plate resulted, with the image exposed areas of the plate being oleophilic and the unexposed areas being hydrophilic.

EXAMPLE 75

Example 3 was repeated, except that 100 grams of a homopolymer of 2,5-dichlorostyrene was used in place of the homopolymer of vinyl chloride. A lithographic printing plate resulted, with the image exposed areas of the plate being oleophilic and the unexposed areas being hydrophilic.

EXAMPLE 76

Example 3 was repeated, except that 100 grams of a homopolymer of 2,6-dichlorostyrene was used in place of the homopolymer of vinyl chloride. A lithographic printing plate resulted, with the image exposed areas of the plate being oleophilic and the unexposed areas being hydrophilic.

EXAMPLE 77

Example 3 was repeated, except that 100 grams of a homopolymer of o-fluorostyrene was used in place of the homopolymer of vinyl chloride. A lithographic printing plate resulted, with the image exposed areas of the plate being oleophilic and the unexposed areas being hydrophilic.

EXAMPLE 78

Example 3 was repeated, except that 100 grams of a homopolymer of p-iodostyrene was used in place of the homopolymer of vinyl chloride. A lithographic printing plate resulted, with the image exposed areas of the plate being oleophilic and the unexposed areas being hydrophilic.

EXAMPLE 79

Example 3 was repeated, except that 100 grams of a homopolymer of p-bromostyrene was used in place of the homopolymer of vinyl chloride. A lithographic printing plate resulted, with the image exposed areas of the plate being oleophilic and the unexposed areas being hydrophilic.

EXAMPLE 80

Example 3 was repeated, except that 100 grams of a homopolymer of p-cyanostyrene was used in place of the homopolymer of vinyl chloride. A lithographic printing plate resulted, with the image exposed areas of the plate being oleophilic and the unexposed areas being hydrophilic.

EXAMPLE 81

Example 3 was repeated, except that 100 grams of a homopolymer of p-phenylstyrene was used in place of the homopolymer of vinyl chloride. A lithographic printing plate resulted, with the image exposed areas of the plate being oleophilic and the unexposed areas being hydrophilic.

EXAMPLE 82

23.8 grams of pentaerythritol tetrakis ($\beta$-mercaptopropionate 25.6 grams of the reaction product of 1 mole of 1,4-butanediol with 2 moles of allyl isocyanate; 0.5 grams of benzophenone; and 50 grams of a homopolymer of vinylidene chloride were thoroughly admixed. The photocurable composition was coated onto a U.V. transparent "Mylar" film support which was 5 mils thick. The thickness of the photocurable composition was about 0.5 mil. A 1-mil-thick U.V. transparent "Mylar" top cover was placed on the photocurable composition layer and the exposed edges of the element were sealed with adhesive tape. The element was exposed through the top cover to a 275-watt RS Sunlamp at a distance of 9 inches through a negative line transparency for 15 minutes at a temperature of 30° C. In the imaged areas the photocurable composition hardened to a solid. The imaged, exposed, photocurable element was placed in an oven, heated to 250° C. for 1 minute, and cooled. A lithographic printing plate was obtained. This example illustrates the use of a monomeric polythiol and a monomeric polyene.

EXAMPLE 83

27 grams of the triacrylate of the reaction product of 1 mole of trimethylol propane with 20 moles of ethylene oxide; 9 grams of pentaerythritol tetrakis ($\beta$-mercaptopropionate); 0.5 gram of benzophenone; and 50 grams of homopolymer of vinylidene chloride were admixed. Example 82 was repeated, except that the above vinyl plastic photocurable composition was substituted for the vinyl plastic photocurable composition used in example 82. A lithographic printing plate was obtained. This example illustrates the use of a reactive ene group conjugated with another double bond grouping (C=O).

EXAMPLE 84

50 grams of a liquid polybutadiene derivative having a molecular weight of 2,200 and a double bond distribution consisting of about 60 percent trans-1,5; about 20 percent cis-1,4; and about 20 percent vinyl-1,2; and which is commercially available from Sinclair Petrochemicals, Inc., name "Poly B-D-R 45-M;" 5 grams of pentaerythritol tetrakis ($\beta$-mercaptopropionate); 0.5 gram of benzophenone; and 60 grams of a homopolymer of vinylidene chloride were admixed. Example 82 was repeated, except that the above vinyl plastic photocurable composition was substituted for the vinyl plastic photocurable composition used in example 82. Thus, a lithographic printing plate was obtained.

EXAMPLE 85

10 grams of "Gentro 1002" (which is the trade name for a solid SBR rubber which is commercially available from General Tire and Rubber Co.), which was dissolved in 50 of decalin (as a solvent); 1 gram of pentaerythritol tetrakis($\beta$-mercaptopropionate); 0.5 gram of benzophenone; and 0.1 gram of silica ("Hi Sil 233"), added as a thickening agent; and 60 grams of a homopolymer of vinylidene chloride were admixed. "Hi Sil 233" is the trade name for finely divided silica filler, having a particle size of 0.03 micron, and is commercially available from PPG Industries Inc. Example 82 was repeated, except that the above vinyl plastic photocurable composition was substituted for the vinyl plastic photocurable composition used in example 82. Thus, a lithographic printing plate was obtained.

EXAMPLE 86

50 grams of "Dion Polymercaptan Resin DPM 1002," which is a thiol terminated liquid polymer, having a functionality of 2 to 3 and a molecular weight of about 5,000, and is commercially available from Diamond Alkali Company; 2.5 grams of triallyl cyanunate; and 0.5 of benzophenone were admixed. dmixed. Example 82 was repeated, except that the above vinyl plastic photocurable composition was substituted for the vinyl plastic photocurable composition used in example 82. Thus, a lithographic printing plate was obtained. This example illustrated the use of a photocurable composition containing a monomeric polyene and a polymeric polythiol.

EXAMPLE 87

Example 82 was repeated, except that the photocurable composition contained 25 grams of the polymeric polyene used in example 52; 30 grams of the polymeric polythiol used in example 86; and 0.5 gram of benzophenone. Thus, a lithographic printing plate was obtained. This example illustrates the use of a photocurable composition containing a polymeric polyene and a polymeric polythiol.

What is claimed is:

1. A process for preparing a lithographic printing plate from a photocurable element, which includes a support layer and a photocurable layer consisting essentially of an admixture of 33–900 parts by weight, based on 100 parts by weight of photocurable composition, of a vinyl plastic in particulate form derived from an addition polymerizable vinyl monomer, in a photocurable composition consisting essentially of 1. about 2 to 98 parts by weight of a polyene containing at least two reactive unsaturated carbon to carbon bonds per molecule,
2. about 98 to 2 parts by weight of a polythiol containing at least two thiol groups per molecule, the total combined functionality of the reactive unsaturated carbon to carbon bonds per molecule in the polyene and the thiol groups per molecule in the polythiol being greater than 4, and
3. about 0.0005 to 50 parts by weight based on 100 parts by weight of (1) and (2) of a photocuring rate accelerator, said process comprising:

a. exposing imagewise, through a stencil, or halftone or line negative transparency, or halftone or line positive transparency, said photocurable layer to ultraviolet radiation, whereby the exposed area of the photocurable layer is cured;
b. heating said photocurable layer until the vinyl plastic in the unexposed area is plasticized and
c. cooling said photocurable layer to obtain a solid plasticized vinyl compound in the unexposed area and a cured polythioether containing vinyl plastic in particulate form in the exposed area, said unexposed area being hydrophilic or oleophilic in relation to said exposed area.

2. A process as described in claim 1 wherein said photocurable composition, which is part of said photocurable layer has a viscosity before mixture with the vinyl plastic of between about 0.25 poise and about 350 poises at a temperature not greater than about 70° C.

3. A process as described in claim 1 wherein said polythiol has a molecular weight between about 50 and about 20,000, and has a viscosity between slightly above 0 and about 20,000,000 centipoises.

4. A process as described in claim 1 wherein said vinyl plastic in particulate form has an average particle size between about 0.01 and about 2,000 microns.

5. A process as described in claim 1 wherein, after said heating step, said exposed areas of the photocurable layer are oleophilic and said unexposed areas of said photocurable layer are oleophilic and said unexposed areas of said photocurable layer are hydrophilic.

6. A process as described in claim 5 wherein said support layer is comprised of a solid, synthetic, polymeric sheet.

7. A process as described in claim 5 wherein said support layer comprises an aluminum layer.

8. A process as described in claim 5 wherein said support layer comprises a curved aluminum layer.

9. A process as described in claim 5 wherein the thickness of the photocurable layer ranges between about 0.01 mil and about 30 mils.

10. A process as described in claim 5 wherein the photocuring is achieved at a temperature between about 20° C. and about 70° C.

11. A process as described in claim 5 wherein the vinyl plastic incorporated in said photocurable layer is the homopolymer of a monomer or copolymer of one or more monomers, each of said monomers containing a vinyl grouping.

12. A process as described in claim 11 wherein the vinyl plastic is derived from an addition polymerizable vinyl monomer having vinyl groups selected from the group consisting of a terminal vinyl group, a vinylidene group and a transoleofinic group.

13. A process as described in claim 5 wherein the plastic vinyl is the homopolymer of vinyl chloride.

14. A process as described in claim 5 wherein the plastic is a copolymer of vinyl chloride and vinyl acetate.

15. A process as described in claim 5 wherein the vinyl plastic is a copolymer of vinyl chloride with vinylidene chloride.

16. A process as described in claim 5 wherein the heating is conducted at a temperature between about 200° F. and about 500° F.

17. A process as described in claim 5 wherein the heating is conducted for a period of time between about 15 seconds and about 15 minutes.

18. A process as described in claim 1 wherein said polyene has a molecular weight in the range of 50 to 20,000; has a viscosity ranging from 0 to 20,000,000 centipoises at 70° C., and has the general formula $[A]-(X)_m$ wherein X is a member of the group consisting of $$R-\overset{R}{\overset{|}{C}}=\overset{R}{\overset{|}{C}}-$$

and R–C≡C–; *m* is an integer of at least 2; R is independently selected from the group consisting of hydrogen, halogen, aryl, substituted aryl, aralkyl, substituted aralkyl, cycloalkyl, substituted cycloalkyl, alkyl and substituted alkyl groups containing 1 to 16 carbon atoms; and A is a polyvalent polymeric organic moiety free of reactive carbon to carbon unsaturation.

19. A process as described in claim 18 wherein the polyene has a molecular weight in excess of 300.

20. A process as described in claim 18 wherein the at least two, unsaturated carbon to carbon bonds in the polyene are located at the end of or pendant to the main chain of the molecule.

21. A process as described in claim 18 wherein the at least two, unsaturated carbon to carbon bonds in the polyene are located within the main chain of the molecule not more than 16 carbon atoms away from an end of the main chain in the molecule.

22. A photocurable element having a a. support layer and a photocurable layer thereon consisting essentially of an admixture of 33–900 parts by weight, based on 100 parts by weight of photocurable composition, of a vinyl plastic in particulate form derived from an addition polymerizable vinyl monomer, in a photocurable composition consisting essentially of 1. about 2 to 98 parts by weight of a polyene containing at least two reactive unsaturated carbon to carbon bonds per molecule,
2. about 98 to 2 parts by weight of a polythiol containing at least two thiol groups per molecule, the total combined functionality of the reactive unsaturated carbon to carbon bonds per molecule in the polyene and the thiol groups per molecule in the polythiol being greater than 4, and
3. about 0.0005 to 50 parts by weight based on 100 parts by weight of (1) and (2) of a photocuring rate accelerator.

23. A lithographic printing plate comprising a support layer, a printing layer thereon comprising an exposed area consisting essentially of a solid photocured polythioether containing solid vinyl plastic in particulate form therein and an unexposed area consisting essentially of vinyl compound plasticized with a photocurable composition consisting essentially of 1. about 2 to 98 parts by weight of a polyene containing at least two reactive unsaturated carbon to carbon bonds per molecule,
2. about 98 to 2 parts by weight of a polythiol containing at least two thiol groups per molecule, the total combined functionality of the reactive unsaturated carbon to carbon bonds per molecule in the polyene and the thiol groups per molecule in the polythiol being greater than 4,
3. about 0.0005 to 50 parts by weight based on 100 parts by weight of (1) and (2) of a photocuring rate accelerator said unexposed area being hydrophilic or oleophilic in relation to said exposed area.

PO-1050
(5/69)

UNITED STATES PATENT OFFICE
CERTIFICATE OF CORRECTION

Patent No. 3,615,448 Dated October 26, 1971

Inventor(s) Leon (NMI) Yeshin

It is certified that error appears in the above-identified patent and that said Letters Patent are hereby corrected as shown below:

Column 26, lines 4 and 5; delete the words "oleophilic and said unexposed areas of said photocurable layer are."

Signed and sealed this 28th day of March 1972.

(SEAL)
Attest:

EDWARD M.FLETCHER,JR.
Attesting Officer

ROBERT GOTTSCHALK
Commissioner of Patents